(12) United States Patent
Amin et al.

(10) Patent No.: US 7,982,307 B2
(45) Date of Patent: *Jul. 19, 2011

(54) INTEGRATED CIRCUIT CHIP ASSEMBLY HAVING ARRAY OF THERMALLY CONDUCTIVE FEATURES ARRANGED IN APERTURE OF CIRCUIT SUBSTRATE

(75) Inventors: Ahmed Amin, Allentown, PA (US); David L. Crouthamel, Bethlehem, PA (US); John W. Osenbach, Kutztown, PA (US); Thomas H. Shilling, Macungie, PA (US); Brian T. Vaccaro, Mertztown, PA (US)

(73) Assignee: Agere Systems Inc., Allentown, PA (US)

( * ) Notice: Subject to any disclaimer, the term of this patent is extended or adjusted under 35 U.S.C. 154(b) by 970 days.

This patent is subject to a terminal disclaimer.

(21) Appl. No.: 11/562,537

(22) Filed: Nov. 22, 2006

(65) Prior Publication Data

US 2008/0116567 A1    May 22, 2008

(51) Int. Cl.
*H01L 23/34* (2006.01)
(52) U.S. Cl. ......... 257/712; 257/E23.105; 257/E23.101; 257/E23.092; 257/734; 257/737; 257/778; 257/783; 257/774; 257/773; 257/680; 257/713; 257/717; 257/720; 257/675
(58) Field of Classification Search .................. 257/778, 257/780, 712, E23.105, 734, 737, 738, 783, 257/774, 773, 680, 713, 717, 720, 675, E23.101, 257/E23.092

See application file for complete search history.

(56) References Cited

U.S. PATENT DOCUMENTS

| | | | | |
|---|---|---|---|---|
| 4,081,825 A * | 3/1978 | Koopman et al. | ............. | 257/713 |
| 4,323,914 A * | 4/1982 | Berndlmaier et al. | ........ | 257/713 |
| 4,647,959 A * | 3/1987 | Smith | ............... | 257/668 |
| 5,766,740 A * | 6/1998 | Olson | ............... | 428/209 |
| 6,566,761 B1 * | 5/2003 | Sharma et al. | ................ | 257/778 |
| 6,873,032 B1 * | 3/2005 | McCann et al. | ............... | 257/673 |
| 7,136,274 B2 * | 11/2006 | Hwang et al. | .............. | 361/306.3 |
| 7,479,695 B2 * | 1/2009 | Bachman et al. | ............. | 257/713 |
| 2003/0214049 A1 * | 11/2003 | Hortaleza et al. | ............. | 257/778 |

(Continued)

FOREIGN PATENT DOCUMENTS

WO    WO2006/043931    4/2006

OTHER PUBLICATIONS

Charles A. Harper, Electonic Packaging and Interconnection Handbook, 2000, 3rd edition, p. 4.12.*

(Continued)

*Primary Examiner* — Alexander O Williams
(74) *Attorney, Agent, or Firm* — Ryan, Mason & Lewis, LLP (57) ABSTRACT

An assembly comprises a stiffener, a circuit substrate and an IC chip. The stiffener has a surface with a first region and a second region. The circuit substrate covers at least a portion of the first region of the stiffener, while the IC chip overlies at least a portion of each of the first and second regions of the stiffener. The assembly further comprises a signal solder bump and a thermally conductive feature. The signal solder bump contacts the IC chip and the circuit substrate. The thermally conductive feature is disposed between, and is metallurgically bonded to, the integrated circuit chip and the second region of the stiffener. The thermally conductive feature provides an efficient thermal conductivity pathway between the IC chip and the stiffener.

20 Claims, 4 Drawing Sheets

U.S. PATENT DOCUMENTS

| | | | |
|---|---|---|---|
| 2004/0164390 A1* | 8/2004 | Wang | 257/686 |
| 2004/0212102 A1* | 10/2004 | Akram et al. | 257/781 |
| 2004/0217485 A1* | 11/2004 | Chung | 257/778 |
| 2005/0037601 A1* | 2/2005 | Hsu et al. | 438/612 |
| 2005/0104222 A1* | 5/2005 | Jeong et al. | 257/778 |
| 2005/0245060 A1* | 11/2005 | Chiu | 438/612 |
| 2006/0060963 A1* | 3/2006 | Chang | 257/706 |
| 2006/0131065 A1* | 6/2006 | Ohwaki | 174/252 |
| 2006/0208365 A1* | 9/2006 | Shen et al. | 257/778 |
| 2007/0075420 A1* | 4/2007 | Lu et al. | 257/720 |
| 2007/0216034 A1* | 9/2007 | Bachman et al. | 257/778 |
| 2008/0026508 A1* | 1/2008 | Archer et al. | 438/122 |
| 2008/0236782 A1* | 10/2008 | Alhayed et al. | 165/41 |
| 2009/0079061 A1* | 3/2009 | Mallik et al. | 257/712 |

OTHER PUBLICATIONS

U.S. Appl. No. 11/375,302, filed Mar. 14, 2006, Bachman et al., "Low Thermal Resistance Assembly for Flip Chip Applications".

* cited by examiner

INTEGRATED CIRCUIT CHIP ASSEMBLY HAVING ARRAY OF THERMALLY CONDUCTIVE FEATURES ARRANGED IN APERTURE OF CIRCUIT SUBSTRATE

CROSS REFERENCE TO RELATED APPLICATIONS

Related patent applications are U.S. patent application Ser. No. 11/375,302, entitled "Low Thermal Resistance Assembly for Flip-Chip Applications," and International Application No. PCT/US2004/033982, entitled "Printed Circuit Board Assembly Having Improved Thermal Energy Dissipation," both commonly assigned herewith and incorporated by reference herein.

FIELD OF THE INVENTION

This invention relates generally to integrated circuit chips, and, more particularly, to flip chips and circuit substrates.

BACKGROUND OF THE INVENTION

Direct chip attachment (DCA) refers to a semiconductor assembly technology wherein an integrated circuit (IC) chip is directly mounted on and electrically connected to its final circuit substrate instead of undergoing traditional assembly and packaging. The elimination of conventional device packaging in DCA both simplifies the manufacturing process and reduces the space that the IC chip occupies on the final circuit substrate. It also improves performance as a result of the shorter interconnection pathways between the IC chip and the circuit substrate.

Flip chips are frequently utilized in DCA applications. A flip chip comprises an IC chip with a multiplicity of solder bumps attached to the chip's bonding pads. During mounting, these solder bumps are directly attached to the circuit substrate. Once attached, the solder bumps serve several functions. Electrically, the solder bumps act to convey signals between the IC chip and circuit substrate. In addition, the solder bumps provide a thermal pathway to carry heat away from the IC chip. The solder bumps also serve to strengthen the mechanical attachment of the IC chip to the circuit substrate. Finally, the solder bumps act to form a space between the IC chip and the circuit substrate, preventing electrical contact between these elements. In the final stages of assembly, this space is usually filled with an electrically nonconductive "underfill." The underfill protects the IC chip from moisture or other environmental hazards, provides additional mechanical strength to the assembly, and acts to reduce the strains in the solder bumps that result from thermal expansion differences between the IC chip and the circuit substrate.

In flip-chip-on-flex (FCoF) applications, the circuit substrate is substantially flexible, while in flip-chip-on-board (FCoB) applications, the circuit substrate is substantially rigid. In either case, the surface of the circuit substrate nearest the flip chip typically comprises a plurality of conductive traces, many of which are attached to the solder bumps of the flip chip. These conductive traces are usually supported by an organic material and act to conduct electrical signals between the flip chip and other electronic devices. In those applications where the circuit substrate is flexible, the surface of the circuit substrate opposed to the flip chip is often attached to a metallic stiffener. The stiffener prevents the circuit substrate from flexing in the region where it is attached to the flip chip. Moreover, in some applications, the stiffener is attached to a support structure that provides additional heat sinking capability above and beyond that of the stiffener.

In applications where the stiffener is attached to a support structure, increasing the rate of heat flow to the stiffener acts to increase the overall rate of heat dissipation from the flip chip. In a typical assembly comprising a flip chip, circuit substrate and stiffener, it is the solder bumps, underfill and circuit substrate that serve to transport the heat generated by the IC chip to the stiffener. Due to the low thermal conductivity of the underfill material, the primary heat dissipation path from the IC chip to the stiffener is through the solder bumps and the circuit substrate. In many flip chip designs however, solder bumps are only placed along the periphery of the IC chip. As a result, this primary heat path is limited by the cumulative cross sectional area of the solder bumps and the low thermal conductivity of the non-electrically conductive materials comprising the circuit substrate. Consequently, these thermal pathways are often inadequate to obtain a desired heat flow. When heat flow from the IC chip to the stiffener is inadequate, the IC chip's functionality and/or speed must be limited so that the IC chip does not exceed a temperature at which its lifetime is adversely affected.

Attempts to increase heat flow from the flip chip to the support structure in FCoF and FCoB applications include increasing the density of the conductive traces on the circuit substrate, increasing the thickness of the conductive traces, using higher thermal conductivity materials for the solder bumps, increasing the number of solder bumps and using higher thermal conductivity underfills. Unfortunately, these attempts typically result in only small improvements to the heat flow from the flip chip. Alternatively, an additional metal heat sink may be attached directly to the non-electrically active surface of the flip chip (i.e., the backside of the IC chip). While effective at increasing the heat flow from the flip chip, this solution results in added cost and may not be possible due to space constraints.

As a result, there is a need for improved flip chip and circuit substrate designs for use in FCoF and FCoB applications that enhance heat dissipation from the flip chip when compared to conventional designs.

SUMMARY OF THE INVENTION

The present invention addresses the above-identified need by providing improved flip chip and circuit substrate designs. Advantageously, embodiments of these designs enhance heat dissipation from the flip chip when compared to conventional designs.

In accordance with an aspect of the invention, an assembly comprises a stiffener, a circuit substrate and an IC chip. The stiffener has a surface with a first region and a second region. The circuit substrate covers at least a portion of the first region of the stiffener, while the IC chip overlies at least a portion of each of the first and second regions of the stiffener. The assembly further comprises a signal solder bump and a thermally conductive feature. The signal solder bump contacts the IC chip and the circuit substrate. The thermally conductive feature is disposed between, and is metallurgically bonded to, the integrated circuit chip and the second region of the stiffener.

In accordance with another aspect of the invention, an apparatus comprises an assembly and a support structure. The assembly is configured like the assembly just described. The support structure is attached to the stiffener and is operative to dissipate heat generated by the IC chip.

In an illustrative embodiment, an assembly comprises a stiffener, a circuit substrate and an IC chip. The circuit substrate is shaped such that it defines an aperture over the stiffener. The IC chip is attached to several signal solder bumps and thermal solder bumps. The signal solder bumps serve to electrically couple the IC chip to the circuit substrate. The thermal solder bumps are metallurgically bonded to the IC chip and that region of the stiffener revealed by the aperture in the circuit substrate. Advantageously, the thermal solder bumps provide an efficient thermal conductivity pathway between the IC chip and the stiffener. Cooling of the IC chip is thereby enhanced by using an assembly in accordance with aspects of the invention.

These and other features and advantages of the present invention will become apparent from the following detailed description which is to be read in conjunction with the accompanying figures.

DETAILED DESCRIPTION OF THE INVENTION

This invention will be illustrated herein in conjunction with exemplary assemblies comprising flip chips and circuit substrates. It should be understood, however, that the invention is not limited to the particular arrangements, materials, structures and processing steps shown and described herein. Modifications to the illustrative embodiments coming within the scope of this invention will become apparent to those skilled in the art from the following description.

It should also be understood that the various elements shown in the accompanying figures are not drawn to scale. Moreover, for economy of description, the figures are restricted to only those regions of the exemplary assemblies that aid in showing aspects of the invention. For example, in actual application, a circuit substrate in accordance with aspects of the invention will likely be more extensive than those circuit substrates illustrated herein. However, these more extensive circuit substrates will still come within the scope of the invention.

Figure 1A:
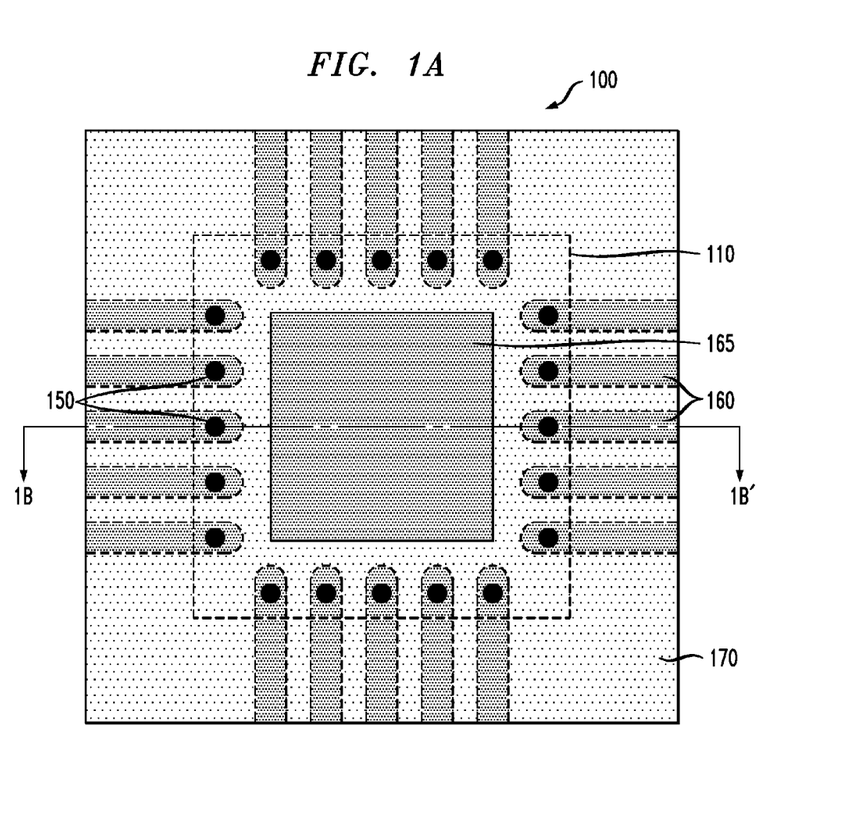
FIG. 1A shows a plan view of a portion of an assembly that can be improved by incorporating aspects of the invention with the IC chip and underfill omitted for clarity.
Figure 1B:
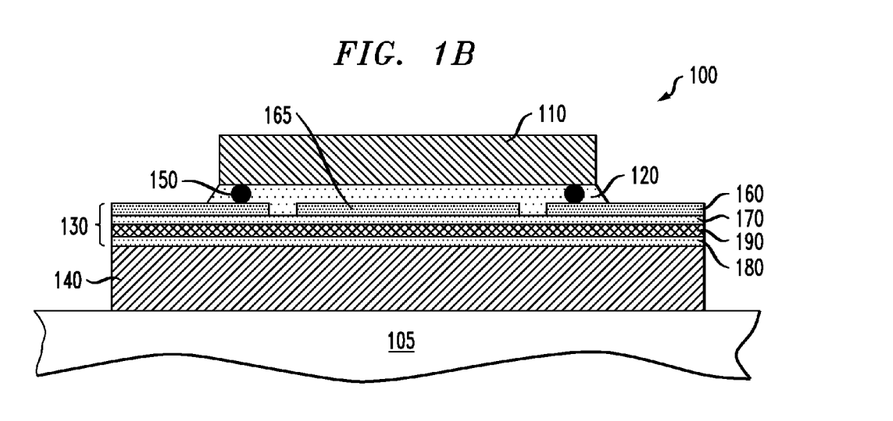
FIG. 1B shows a sectional view of the FIG. 1A assembly including the IC chip and underfill.

FIGS. 1A and 1B show an assembly 100 for use in FCoF applications that can be improved by incorporating aspects of the invention. FIG. 1A shows a plan view, while FIG. 1B shows a sectional view cut in a plane indicated in FIG. 1A. The assembly is attached to a support structure 105. The assembly comprises an IC chip 110, an underfill 120, a circuit substrate 130, a stiffener 140 and a plurality of solder bumps 150. The IC chip and the underfill are shown as a dashed outline in FIG. 1A to reveal details of the underlying elements.

The circuit substrate 130, in turn, comprises numerous conductive traces 160, which are attached to the solder bumps 150. Additionally, a conductive plate 165 is disposed between the conductive traces on the circuit substrate to aid in cooling the IC chip 110. The circuit substrate also comprises adhesive layers 170 and 180, as well as a polyimide layer 190. The polyimide layer gives the circuit substrate flexibility.

Electrical signals are transmitted between the IC chip 110 and the circuit substrate 130 through the solder bumps 150. The IC chip has its bond pads located proximate to one or more of its peripheral edges. The IC chip is therefore of a "peripheral I/O" type. Peripheral I/O IC chips are conventionally used in semiconductor technology and will be familiar to one skilled in that art.

Like most other types of IC chips, the IC chip 110 generates significant amounts of heat during its operation. To dissipate this heat, the stiffener 140 comprises a metallic material with a high thermal conductivity such as aluminum, silver, copper or gold. Heat transported to the stiffener, in turn, is transferred to the attached support structure 105. The support structure acts as a heat sink to dissipate the heat. The precise design of the support structure will depend on the particular application in which the assembly is utilized. However, it will typically comprise a metallic structure with a relatively large mass in comparison to the assembly 100.

Heat generated by the IC chip 110 is transferred to the stiffener 140 by some combination of the solder bumps 150, the underfill 120, and those elements forming the circuit substrate 130. As mentioned before, due to the large difference in thermal conductivity of the solder bumps relative to the underfill, the primary heat flow path from the IC chip to the stiffener is through the solder bumps and the circuit substrate. In this way, the thermal resistance of the solder bumps and the circuit substrate act in a series combination. The rate of heat flow in these elements, however, is ultimately limited by the low thermal conductivity of the non-electrically conductive materials comprising the circuit substrate like the adhesive layers 170, 180 and the polyimide layer 190.

Figure 2A:
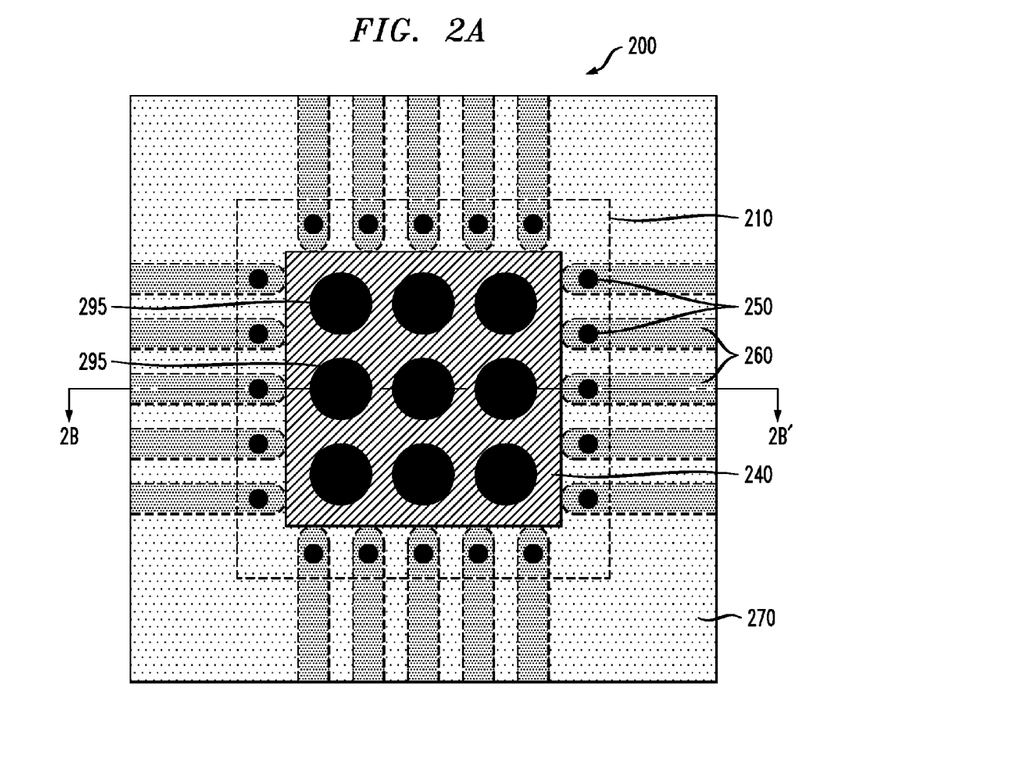
FIG. 2A shows a plan view of a portion of an assembly in accordance with a first illustrative embodiment of the invention with the IC chip and underfill omitted for clarity.
Figure 2B:
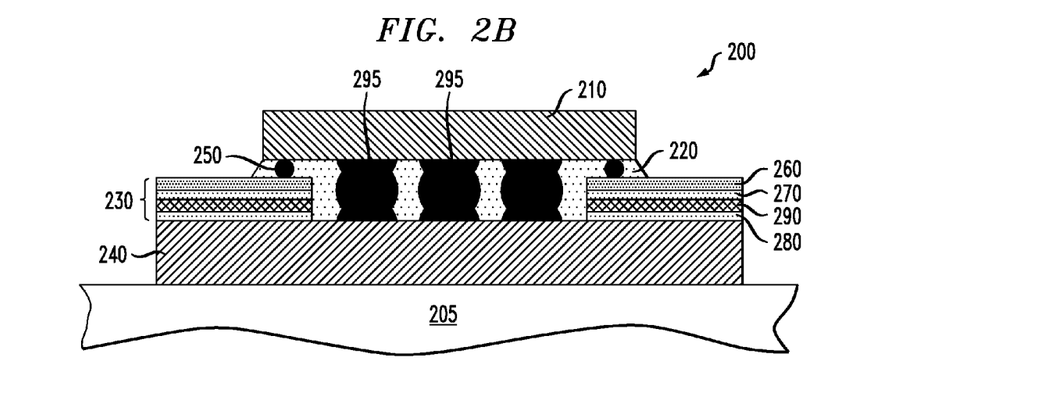
FIG. 2B shows a sectional view of the FIG. 2A assembly including the IC chip and underfill.

FIGS. 2A and 2B, in contrast, show an illustrative embodiment of an assembly in accordance with aspects of the invention. FIG. 2A shows a plan view, while FIG. 2B shows a sectional view cut in a plane indicated in FIG. 2A. The assembly 200 is attached to a support structure 205 that acts as a heat sink for the assembly. Like the assembly 100 shown in FIGS. 1A and 1B, the assembly 200 comprises an IC chip 210, an underfill 220, a circuit substrate 230 and a stiffener 240. As before, the IC chip and the underfill in FIG. 2A are shown as a dashed outline to reveal details of the underlying elements.

Reference to FIGS. 2A and 2B shows that the IC chip 210 is attached to a plurality of signal solder bumps 250 that are arranged proximate to the periphery of the IC chip. The circuit substrate 230 comprises a plurality of conductive traces 260, which are also attached to the signal solder bumps. The circuit substrate further comprises adhesive layers 270 and 280, as well as a polyimide layer 290. The polyimide layer gives the circuit substrate flexibility. However, in other embodiments, the circuit substrate need not be flexible. These other embodiments may be utilized in, for example, FCoB applications.

The circuit substrate 230 only covers a portion of the stiffener 240, thereby defining an aperture over the stiffener. Moreover, the IC chip 210 comprises several thermal solder bumps 295. These thermal solder bumps pass through the aperture in the circuit substrate and attach to the exposed portion of the stiffener. The underfill 220, in turn, fills the remaining space between the IC chip, the circuit substrate and the stiffener. In this example, the thermal solder bumps are substantially larger than the signal solder bumps 250, but this need not be the case as described in greater detail below.

The thermal solder bumps 295 are metallurgically bonded to both the IC chip 210 and the stiffener 240. One skilled in the art will recognize that one metallic material is metallurgically bonded to another metallic material when the two materials attach to one another through the interdiffusion of the metallic materials and/or through a chemical reaction between the metallic materials. Metallurgically bonded materials can be distinguished from materials that merely contact each other as a result of forces that act to compress the materials together. Metallurgical bonds tend to be relatively strong and display good heat conduction properties.

The assembly 200 in FIGS. 2A and 2B greatly enhances heat flow from the IC chip 210 to the stiffener 240 and the support structure 205 (i.e., heat sink) relative to the assembly 100 shown in FIGS. 1A and 1B. This occurs in large part because the thermal solder bumps provide a high thermal conductivity path directly from the IC chip to the stiffener. One skilled in the art will recognize that the thermal solder bumps 295, because of both their dimensions and metallic composition, will typically have a thermal resistance value that is substantially smaller than that of either the underfill 220 or the circuit substrate 230. For example, a typical solder composed of lead and tin that is utilized to form solder bumps has a thermal conductivity of about 51 (W/(m-K)). A polyimide material and conventional underfills, on the other hand, have thermal conductivities of about 0.15 and 0.25-1.1 (W/(m-K)), respectively (Source: C. Harper, editor, *Electronic Materials and Processes Handbook, Third Edition*, McGraw-Hill, 2003, incorporated herein by reference).

As a result, the assembly 200 will be characterized by a substantially lower thermal resistance between the IC chip 210 and the stiffener 240 than that in the assembly 100, resulting in an enhanced rate of heat dissipation from the IC chip. For example, preamplifier IC chips in FCoF assemblies in accordance with aspects of this invention have been experimentally determined to have a thermal impedence 60% lower than that of conventional FCoF designs. Accordingly, aspects of the invention allow IC chips to operate at lower temperatures, thereby enhancing their lifetimes.

It is noted that the arrangement of the thermal solder bumps 295 in FIGS. 2A and 2B is purely illustrative and other arrangements would still come within the scope of this invention. For example, the thermal solder bumps may optionally be arranged so that two or more thermal solder bumps are in physical contact with one another. This alternative arrangement may allow a greater number of thermal solder bumps to be bridged between the IC chip 210 and the stiffener 240, thereby further improving the heat dissipation from the IC chip.

Advantageously, the assembly 200 in FIGS. 2A and 2B may be formed using largely conventional processing steps. One skilled in the art will recognize how these processing steps are accomplished to produce embodiments in accordance with aspects of the invention. Moreover, these processes are described in a number of readily available references including, for example, M. Datta et al., *Microelectronic Packaging*, CRC Press, 2005, which is incorporated herein by reference.

Figure 3:
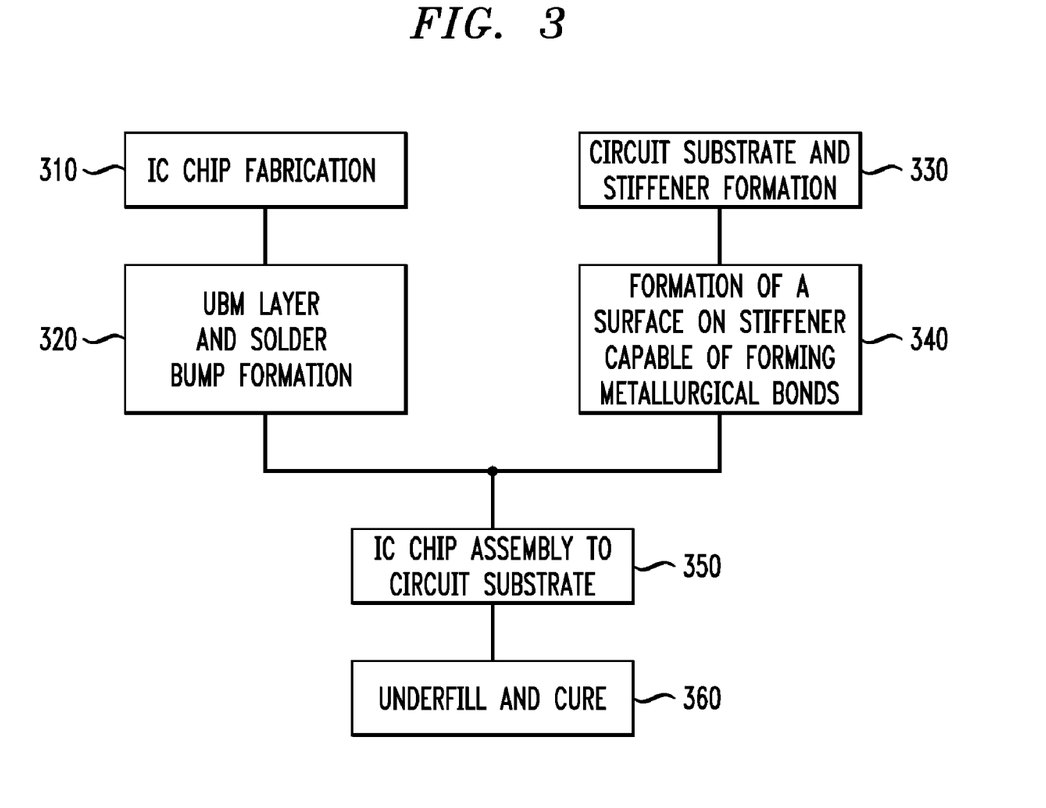
FIG. 3 shows a block diagram of an illustrative process flow for forming the assembly in FIGS. 2A and 2B.

FIG. 3 is a block diagram that shows exemplary processing steps that may be used to form the assembly 200. It should be noted, however, that this particular process methodology is illustrative and that there are several alternative methods of forming the assembly that will be familiar to one skilled in the art and that will come within the scope of this invention.

Step 310 in FIG. 3 comprises formation of the IC chip 210. For purposes of this description, the IC chip is fabricated with electrically active aluminum bond pads which are exposed through a final protective passivation layer. Subsequently, in step 320, an Under Bump Metallization (WBM) layer as well as the signal and thermal solder bumps 250, 295 are formed on the IC chip. The UBM layer serves as the metallurgical bonding surface for the signal and thermal solder bumps. For the signal solder bumps, the UBM layer is formed on the electrically active aluminum bond pads of the IC chip. For the thermal solder bumps, the UBM layer is formed on either aluminum bond pads or directly on the final passivation layer of the IC chip in a region where no aluminum bond pads are exposed. The UBM layer may comprise, for example, a sputtered tri-layer of aluminum, vanadium-doped nickel, and copper, although several other well-known alternatives exist and would fall within the scope of this invention.

Advantageously, formation of the thermal solder bumps 295 can be accomplished at the same time as forming the signal solder bumps 250, thereby incurring little additional cost during fabrication. For purposes of this example, the signal and thermal solder bumps are deposited by printing. It should be noted, however, that there are several other methods of forming solder bumps including, but not limited to, evaporation, electroplating, stud bumping and direct placement. Any one of these methods would still come within the scope of this invention.

To print the signal and thermal solder bumps 250, 295, a stencil is applied to the surface of the IC chip 210. The stencil has apertures that overly those regions of the IC chip where signal and thermal solder bumps are desired. A printing tool then applies a solder paste to the stencil. The printing tool has a squeegee that moves across the stencil. During printing, the solder paste rolls in front of the squeegee, filling the apertures in the stencil some distance ahead of the squeegee. The squeegee then shears off the paste in the apertures as it continues to move over the stencil. Hydrodynamic pressure generated by the squeegee injects the paste into the apertures. Once the print stroke is complete, the IC chip is separated mechanically from the stencil.

After applying the solder paste in this manner, the solder paste is reflowed at an elevated temperature greater than or equal to the melting point of the solder. During the reflow, volatile elements in the solder paste evaporate, leaving behind molten solder. The molten solder agglomerates and forms metallurgical bonds with the UBM layer on the IC chip 210. After reducing the temperature, a suitable solvent (e.g., water) may then be used to remove any contaminants remaining from the solder paste.

The signal and thermal solder bumps 250, 295 may comprise various different materials. They may be formed, for example, from an alloy comprising tin and lead (e.g., 63 at. % tin and 37 at. % lead). Alternatively, they may comprise a lead-free solder such as tin and silver, or tin, silver and copper.

Step 330 in FIG. 3 comprises the formation of the circuit substrate 230 and the stiffener 240. An aperture is formed in the circuit substrate exposing a portion of the stiffener surface in a region under the IC chip 210 where the thermal connections are made between the IC chip and the stiffener. Step 340 comprises the formation of a surface on the stiffener that readily forms a metallurgical bond to the thermal solder bumps 295. In the case of an aluminum stiffener, the surface may first be cleaned and treated with a commercially available alkaline zincate solution. This is followed by the formation of a bi-layer nickel-tin surface via electrochemical plating of nickel-tin or by electroless plating of nickel in a solution comprising tin. One skilled in the art will recognize, however, that other techniques may be used to form a solderable surface on aluminum or other thermally conductive materials.

In step 350, an assembly step comprises joining the IC chip 210 to the circuit substrate 230 and stiffener 240. First, a flux may be applied to the signal and thermal solder bumps 250, 295 to promote the formation of metallurgical bonds. Next, the IC chip is aligned and placed in contact with the circuit substrate. Subsequently, the entire assembly is exposed to another elevated-temperature reflow process. This reflow process allows the signal and thermal solder bumps to form metallurgical bonds with the conductive traces present on the circuit substrate and with the surface of the stiffener.

Subsequently, in step 360, the underfill 220 is formed in the region between the IC chip 210, circuit substrate 230 and stiffener 240 by dispensing liquid underfill material along one or more edges of the IC chip. The liquid underfill material is pulled between the IC chip, circuit substrate and stiffener by capillary forces. Once the underfill dispense process is complete, the underfill material is subsequently cured by applying heat (e.g. by using a conventional heating oven) so that it becomes substantially rigid and attains its final mechanical characteristics. Note that alternative methods of underfill application may be used, such as a reflow type encapsulant (commonly referred to as "no-flow" underfill).

Figure 4:
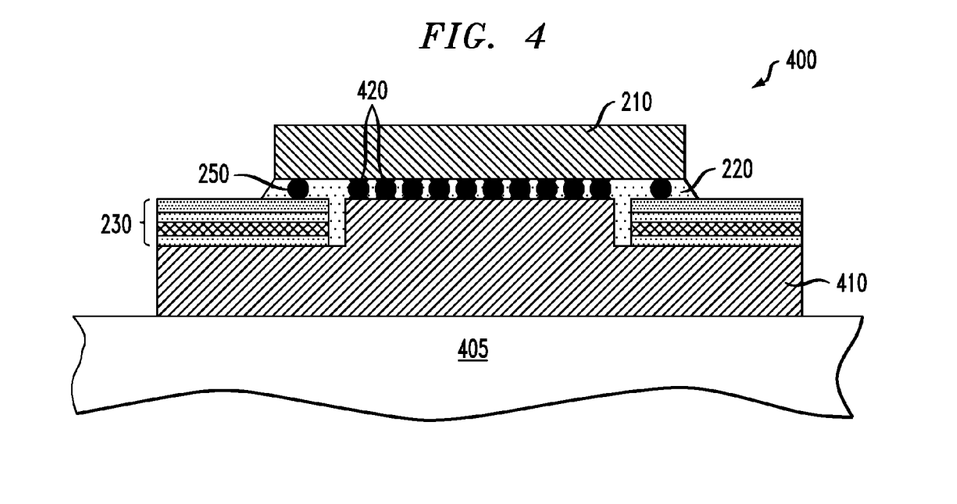
FIG. 4 shows a sectional view of an assembly in accordance with a second illustrative embodiment of the invention.

As mentioned earlier, an assembly need not comprise thermal solder bumps that are larger than the signal solder bumps to fall within the scope of this invention. FIG. 4 shows a sectional view of an assembly 400 in accordance with a second illustrative embodiment of the invention. The assembly comprises many elements identical to those shown in FIG. 2B, and these identical elements are labeled with identical reference numerals. In accordance with an aspect of the invention, however, the assembly 400 comprises a modified stiffener 410. This modified stiffener comprises a step that protrudes into the aperture defined by the circuit substrate. The step acts to bring the uppermost surface of the stiffener closer in proximity to the IC chip. This closer proximity, in turn, allows smaller thermal solder bumps 420 to be utilized to thermally couple the IC chip to the stiffener. In this particular assembly, the thermal solder bumps have substantially the same size as the signal solder bumps 250.

Figure 5:
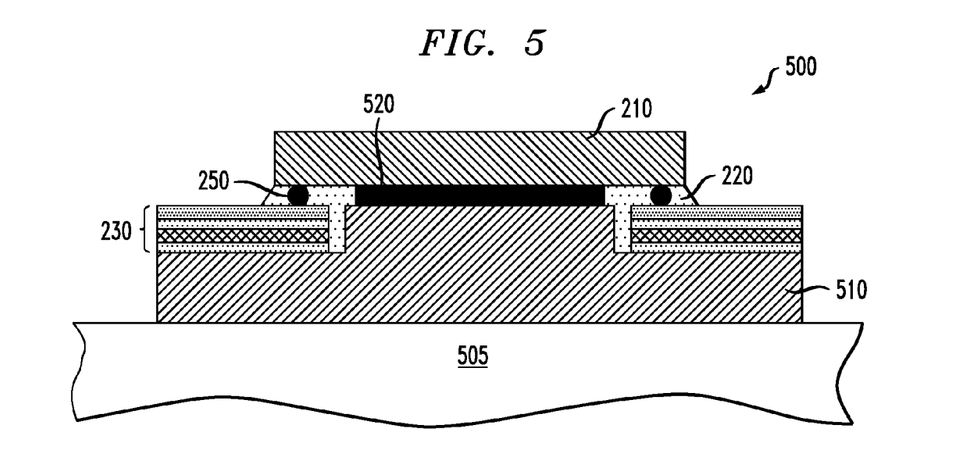
FIG. 5 shows a sectional view of an assembly in accordance with a third illustrative embodiment of the invention

The thermal connection between the IC chip and the stiffener also need not be restricted to solder bumps. Instead, for example, a layer of solder or other thermally conductive material (e.g., nickel, aluminum, tungsten, indium and copper) may be used to create a thermal connection between these two elements. FIG. 5 shows a sectional view of an assembly 500 in accordance with such an illustrative embodiment of the invention. As for the assembly 400, the assembly 500 comprises many elements identical to those shown in FIG. 2B, which are labeled with identical reference numerals. The assembly comprises a stiffener 510 with a step feature similar to that in the assembly 400. A layer of solder 520 lies between the IC chip 210 and the stiffener. The layer of solder is metallurgically bonded to both the IC chip and the stiffener in order to create a highly efficient thermal pathway.

Assembly 500 may be formed in a manner similar to that described above for the assembly 200. A UBM layer is formed on either exposed aluminum bond pads or directly on the final passivation layer of the IC chip 210 to create a surface that will form a metallurgical bond with the layer of solder 520. The layer of solder may be applied to the IC chip 210 using a printing process similar to that described above for forming solder bumps.

It is again emphasized that, although illustrative embodiments of the present invention have been described herein with reference to the accompanying figures, the invention is not limited to those precise embodiments. For example, the materials and structures forming a flip chip or circuit substrate may differ from those described in the illustrative embodiments and still come within the scope of the invention. Moreover, an assembly in accordance with aspects of the invention may be formed using a processing sequence different from that described in the illustrative process sequence and still come within the invention. One skilled in the art will recognize various other changes and modifications that may be made without departing from the scope of the appended claims.

What is claimed is:

1. An assembly comprising:
    a stiffener, the stiffener having a surface comprising a first region and a second region;
    a circuit substrate, the circuit substrate covering at least a portion of the first region of the stiffener;
    an integrated circuit chip, the integrated circuit chip overlying at least a portion of each of the first and second regions of the stiffener;
    a plurality of signal solder bumps, each of the plurality of signal solder bumps contacting the integrated circuit chip and the circuit substrate; and
    a plurality of thermally conductive features, each of the plurality of thermally conductive features being disposed between, and being metallurgically bonded to, the integrated circuit chip and the second region of the stiffener;
    wherein the circuit substrate has an aperture formed therethrough over the second region; and
    wherein the thermally conductive features are arranged within the aperture in the form of an array of thermally conductive features.

2. The assembly of claim 1, wherein the plurality of signal solder bumps is operative to conduct electrical signals between the integrated circuit chip and the circuit substrate.

3. The assembly of claim 1, wherein at least one or more thermally conductive features comprises a layer of metallic material operative to conduct heat from the integrated circuit chip to the stiffener.

4. The assembly of claim 1, wherein at least one of the plurality of thermally conductive features comprises a thermal solder bump operative to conduct heat from the integrated circuit chip to the stiffener.

5. The assembly of claim 4, wherein the thermal solder bump is substantially larger than at least one of the plurality of signal solder bumps.

6. The assembly of claim 4, wherein the thermal solder bump is substantially the same size as at least one of the plurality of signal solder bumps.

7. The assembly of claim 1, wherein the first region of the stiffener is not coplanar with the second region of the stiffener.

8. The assembly of claim 1, wherein a portion of the stiffener protrudes into an aperture defined by the circuit substrate.

9. The assembly of claim 1, wherein the first region of the stiffener substantially surrounds a periphery of the second region of the stiffener.

10. The assembly of claim 1, wherein the circuit substrate comprises a plurality of conductive traces, each of the plurality of conductive traces electrically coupled to respective ones of the plurality of signal solder bumps.

11. The assembly of claim 1, further comprising an underfill, the underfill filling at least a portion of a space between the integrated circuit chip and the circuit substrate.

12. The assembly of claim 1, wherein at least one of the plurality of thermally conductive features comprises a material having a thermal conductivity greater than about 10 Watts per meter-Kelvin (W/(m-K)).

13. An apparatus including:
an assembly, the assembly comprising:
a stiffener, the stiffener having a surface comprising a first region and a second region;
a circuit substrate, the circuit substrate covering at least a portion of the first region of the stiffener;
an integrated circuit chip, the integrated circuit chip overlying at least a portion of each of the first and second regions of the stiffener;
a plurality of signal solder bumps, each of the plurality of signal solder bumps contacting the integrated circuit chip and the circuit substrate;
a plurality of thermally conductive features, each of the plurality of thermally conductive features being disposed between, and being metallurgically bonded to, the integrated circuit chip and the second region of the stiffener; and
a support structure, the support structure attached to the stiffener and operative to dissipate heat generated by the integrated circuit chip;
wherein the circuit substrate has an aperture formed therethrough over the second region; and
wherein the thermally conductive features are arranged within the aperture in the form of an array of thermally conductive features.

14. The assembly of claim 1, wherein the circuit substrate is substantially flexible.

15. The assembly of claim 1, wherein the circuit substrate is substantially rigid.

16. A method of forming an assembly, the method comprising the steps of:
forming a stiffener, the stiffener having a surface comprising a first region and a second region;
forming a circuit substrate, the circuit substrate covering at least a portion of the first region of the stiffener;
forming an integrated circuit chip, the integrated circuit chip overlying at least a portion of each of the first and second regions of the stiffener;
forming a plurality of signal solder bumps, each of the plurality of signal solder bumps contacting the integrated circuit chip and the circuit substrate; and
forming a plurality of thermally conductive features, each of the plurality of thermally conductive features being disposed between, and being metallurgically bonded to, the integrated circuit chip and the second region of the stiffener;
wherein the circuit substrate has an aperture formed therethrough over the second region; and
wherein the thermally conductive features are arranged within the aperture in the form of an array of thermally conductive features.

17. The method of claim 16, wherein the thermally conductive features are bonded to the integrated circuit chip before they are bonded to the stiffener.

18. The method of claim 16, wherein the thermally conductive features are bonded to the stiffener before they are bonded to the integrated circuit chip.

19. The assembly of claim 1, wherein the stiffener comprises aluminum, copper, gold, silver or iron, or a combination thereof.

20. The assembly of claim 1, wherein the stiffener comprises a layer formed of nickel or tin, or a combination thereof.

* * * * *